US007327288B2

(12) United States Patent
Zoso et al.

(10) Patent No.: US 7,327,288 B2
(45) Date of Patent: Feb. 5, 2008

(54) VARIABLE INTERPOLATOR FOR NON-UNIFORMLY SAMPLED SIGNALS AND METHOD

(75) Inventors: Luciano Zoso, Chandler, AZ (US); Allan P. Chin, Chandler, AZ (US); David P. Lester, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 11/394,254

(22) Filed: Mar. 30, 2006

(65) Prior Publication Data

US 2006/0244644 A1 Nov. 2, 2006

Related U.S. Application Data

(63) Continuation-in-part of application No. 11/117,820, filed on Apr. 29, 2005.

(51) Int. Cl.
*H03M 7/00* (2006.01)

(52) U.S. Cl. ........................................ 341/61; 708/313

(58) Field of Classification Search .................. 341/61; 713/313
See application file for complete search history.

(56) References Cited

U.S. PATENT DOCUMENTS 5,592,517 A * 1/1997 Camp et al. ................ 708/313
6,498,823 B1 * 12/2002 Samueli et al. ............. 708/313

FOREIGN PATENT DOCUMENTS

GB 2125255 A 2/1984

OTHER PUBLICATIONS

Crochiere et al, Interpolation and Decimation of Digital Signals-A Tutorial Review, Proceedings of the IEEE, vol. 69, No. 3, pp. 300-311, Mar. 1981.*

Samadi, S. Complete Characterization of Systems for Simultaneous Lagrangia Upsampling and Fractional-Sampling Delaying, IEEE Transactions on Circuits and Systems vol. 52, No. 3, Mar. 2005 pp. 656-667.*

Hogenauer, E. An Economical Class of Digital Filters for Decimation and Interpolation, IEEE Transactions on Acoustics, Speech, and Signal Processing, vol. ASSP-29, No. 2, Apr. 1981, pp. 155-162.*

En 300 163 European Standard; Television Systems; NICAM 728: transmission of two-channel digital sound with terrestrial television systems B, G, H, I, K1 and L; Mar. 3, 1998; ;pp. 1-24; V1.2.1; European Telecommunications Standard Institute; France.

* cited by examiner

*Primary Examiner*—Howard L. Williams
(74) *Attorney, Agent, or Firm*—Michael Balconi-Lamica

(57) ABSTRACT

A variable interpolator (110) has an interpolation factor L for performing an interpolation of an input signal (124), where L is variable and includes a minimum value. The variable interpolator includes a differentiator (110-1), a chopper (112), and an integrator (110-2). The differentiator (110-1) is responsive to a signal on the differentiator input for performing a differentiator portion of the interpolation and for providing a differentiator result signal (134). The chopper is coupled with the differentiator for chopping the differentiator result signal as a function of the minimum value of L, wherein for an interpolator input signal that contains non-uniformly sampled signals in which there exists at least one sample of a shortest duration and at least one sample of a duration that extends beyond the shortest duration, the minimum value of L corresponds to the duration of the sample of shortest duration, and wherein for an interpolator input signal that contains uniformly sampled signals in which the samples are of a fixed duration, the minimum value of L corresponds to the fixed duration. The integrator is responsive to the chopped differentiator result signal for performing an integrator portion of the interpolation and for providing an integrator result signal, corresponding to an output (142) of the variable interpolator.

17 Claims, 4 Drawing Sheets

VARIABLE INTERPOLATOR FOR NON-UNIFORMLY SAMPLED SIGNALS AND METHOD

CROSS-REFERENCE TO CO-PENDING APPLICATIONS

This application is a continuation-in-part of co-pending patent application Ser. No. 11/117,820 filed on Apr. 29, 2005, entitled "FRONT-END METHOD FOR NICAM ENCODING" to Zoso et al. and co-pending patent application Ser. No. 11/118,211 filed on Apr. 29, 2005, entitled "NICAM ENCODER WITH A FRONT END" to Zoso et al., now U.S. Pat. No. 7,109,906, issued Sep. 9, 2006.

BACKGROUND

The present disclosures relate to interpolators, and more particularly, to a $SINC^2$ interpolator for non-uniformly sampled signals.

The present disclosure further relates to stereophonic audio encoders used for audio/video consumer electronics, and more particularly, to a variable interpolator for a single-chip NICAM (Near-Instantaneously Companded Audio Multiplex) encoder and/or other applications involving Sigma-Delta digital-to-analog converters (DACs).

At present in Europe, DVD players, stereo VCRs, set-top boxes and similar audio/video appliances output composite video and stereo audio via 21-pin SCART (Syndicat francais des Constructeurs d'Appareils de Radio et de Télévision) connectors or via three separate connectors (i.e., video, left audio, right audio). A NICAM encoder with an RF modulator can provide composite video and high-quality stereo sound through a single RF coaxial cable. This allows consumer electronics manufacturers to lower the overall system cost. Furthermore, it will greatly simplify the typical home entertainment wiring.

NICAM encoders, as are used in TV stations, are very expensive rack mount units. Alternatively, less expensive versions of NICAM encoders for other applications still require a circuit board with many discrete components.

Cost and complexity of the traditional encoders are due to several issues, for example, as has been addressed in the patent applications identified herein with respect to the cross-reference to related applications. In one application, a NICAM front-end utilizes a single clock and replaces almost entirely the analog blocks of traditional implementations with digital circuitry. In another, a NICAM processor implements the NICAM algorithm in a very efficient way.

In copending patent application Ser. No. 11/118,211, entitled "NICAM ENCODER WITH A FRONT END" to Zoso et al., the front-end output section generates from the system clock the symbol rate for the QPSK transmitter with a timing circuit, the timing circuit producing a clock which only on an average has a value of 364 kHz. In addition, the front-end output section upsamples the in-phase and quadrature signals to the system clock frequency prior to performing the QPSK modulation with the use of two interpolators. The first of the interpolators is a fixed interpolator, whereas, the second of the interpolators is a variable interpolator. The second interpolator performs a variable interpolation by a factor L for processing non-uniformly sampled signals. While finite impulse response (FIR) and infinite impulse response (IIR) interpolators, sampled at the system clock, could be used for variable interpolation of the non-uniformly sampled signals, the FIR and IIR interpolators are very hardware intensive to implement and thus not very desirable in a cost-effective implementation.

Accordingly, there is a need for a variable interpolator method and apparatus for overcoming the problems in the art as discussed above.

BRIEF DESCRIPTION OF THE DRAWINGS

The embodiments of the present disclosure are illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present disclosure.

DETAILED DESCRIPTION

According to one embodiment of the present disclosure, a $SINC^2$ interpolator, implemented with a differentiator and an integrator, includes a chopper configured to process an input signal that contains non-uniformly sampled signals (i.e., samples of different durations). The chopper forces to zero any portion of the differentiator output sample of the $SINC^2$ interpolator having a duration that lasts longer than the duration of a shortest sample of the differentiator output signal. The initial portion of each sample of the differentiator output signal is not impacted or affected. However, only that portion of a sample of the differentiator output signal that extends beyond the duration of the shortest sample (i.e., sample of the shortest duration) is zeroed.

In this way, the non-zero portion of each sample of the differentiator output signal is the same duration. As a result, the differentiator portion of the $SINC^2$ interpolator, coupled with the chopper, correctly performs a difference operation on the samples of the input signal. In other words, for an input signal that contains non-uniformly sampled signals, the $SINC^2$ interpolator with a chopper according to the embodiments of the present disclosure post-processes the output of the differentiator portion of the $SINC^2$ interpolator so that only the initial parts of the samples with a duration corresponding to the shortest sample of an input signal are integrated by the integrator. In contrast, without the chopper, the integrator would have integrated erroneous results produced by the differentiator by processing samples of different durations.

Figure 1:
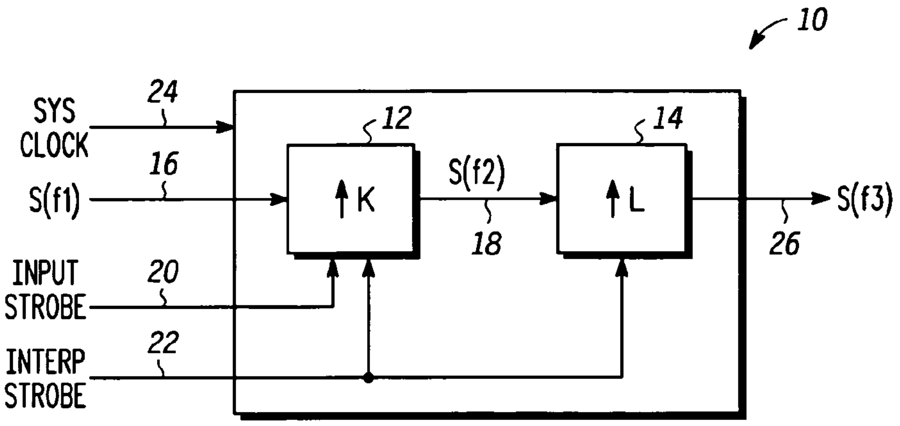
FIG. 1 is a block diagram view of an interpolator function block according to one embodiment of the present disclosure.

With reference now to FIG. 1, an interpolator function block 10 comprises a first interpolator 12 having a fixed interpolation factor (K), and a second interpolator 14 having a variable interpolation factor (L). As will be discussed further herein, the second interpolator 14 upsamples its input signal with a variable interpolation factor (L). A signal input of the first interpolator 12 occurs at a first frequency, designated by $S(f_1)$, on signal line 16. The signal output of the first interpolator 12 occurs at a second frequency, designated by $S(f_2)$, on output signal line 18. In one embodiment, responsive to the input signal $S(f_1)$ on input signal line 16, as well as in response to an input strobe on signal line 20 and an interpolator strobe on signal line 22, the first interpolator 12 upsamples the input signal with a fixed interpolation factor (K) into the output signal at the second frequency, $S(f_2)$, on output signal line 18. A system clock is also provided to the interpolator function block 10 on system clock signal line 24.

Further as illustrated in FIG. 1, the signal output 18 of the first interpolator 12, indicated by $S(f_2)$, corresponds to the input of the second interpolator 14. The signal output of the second interpolator 14 occurs at a third frequency, designated by $S(f_3)$, on output signal line 26. Responsive to the input signal $S(f_2)$ on signal line 18, as well as in response to the interpolator strobe on signal line 22, the second interpolator 14 upsamples the input signal $S(f_2)$ on signal line 18 with a variable interpolation factor (L) into the output signal at the third frequency, $S(f_3)$, on output signal line 26. In one embodiment, $f_3$ is the frequency of the system clock. In another embodiment, a strobe is used to indicate when samples are valid at the output of interpolator 14.

In the example shown in FIG. 1, signal 26 is sampled directly at the system clock, but in other cases the system may use a strobe to sample the signal. In the later instance, the system clock will have a higher frequency than $f_3$. The input strobe on signal line 20 and the interpolator strobe on signal line 22 together provide an indication of when data on signal input 16 originating from another device (such as a NICAM processor) is valid and when interpolated samples must be provided to interpolator 14. In addition, the interpolator strobe corresponds to a periodic pulse that is L times slower than the system clock, where L is the interpolation factor. The input strobe is K times slower than the interpolator strobe. In another embodiment, clocks are directly provided at the frequencies $f_1$, $f_2$ and $f_3$ instead of strobes. In one embodiment, the first frequency corresponds to 364 kHz, the second frequency corresponds to 1.456 MHz, and the third frequency corresponds to 24 MHz.

Accordingly, for this example, the average interpolation introduced by the variable interpolator 14 is substantially equivalent to 24 MHz divided by 1.456 MHz which equals 16.48351648 (i.e., 24 MHz/1.456 MHz=16.48351648). In one embodiment, during a frame of 1 ms duration, the variable interpolator 14 interpolates 752 times by 16 and 704 times by 17. This means that by design the variable interpolator 14 (or its associated clock) has a jitter of 41.666 ns (i.e., one cycle of 24 MHz). The variable interpolator 14 thus allows data signals (corresponding to the output of the fixed interpolator 12 on signal line 18) to be interpolated up to a clock frequency of the system clock (i.e., 24 MHz). In one embodiment, the variable interpolator 14 is implemented as a $SINC^2$ filter including a chopper as discussed herein.

Figure 2:
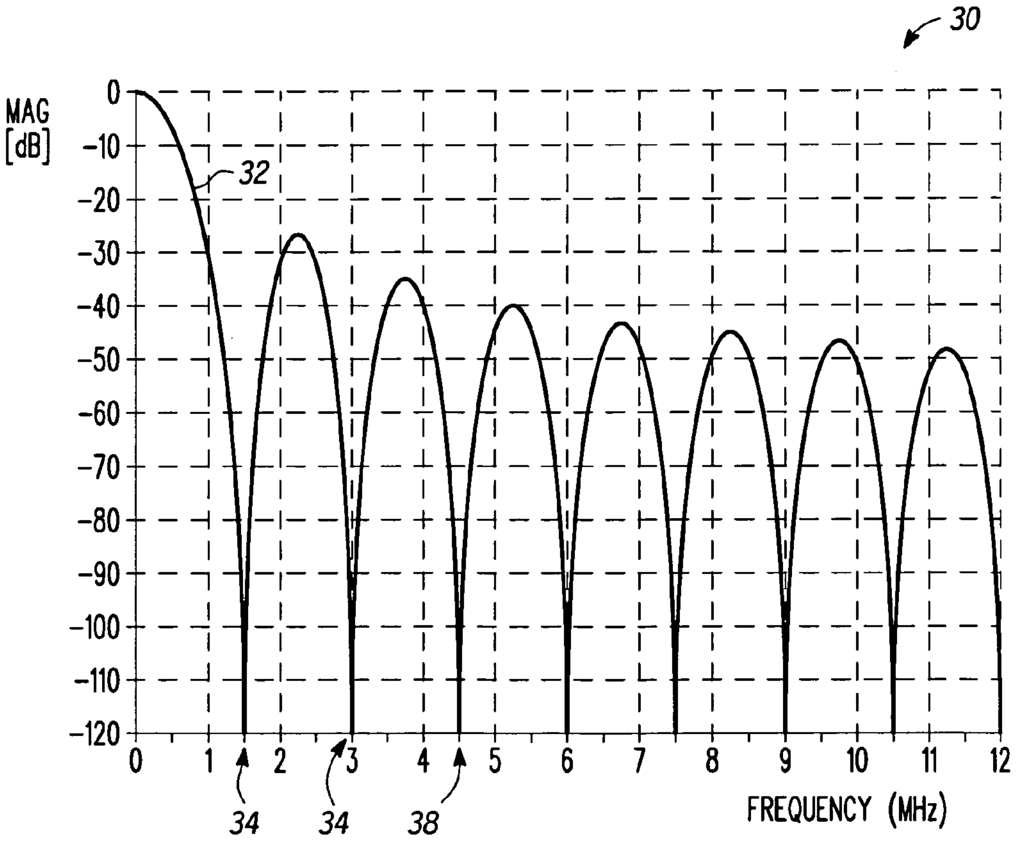
FIG. 2 is a graphical representation view of an amplitude response of a $SINC^2$ interpolator.

FIG. 2 is a graphical representation view of the amplitude response of a $SINC^2$ filter or interpolator having an interpolation factor of 16. For the $SINC^2$ filter, its amplitude response is twice that of a standard SINC filter; that is, equivalent to the amplitudes (in dB) of the lobes of the standard SINC filter multiplied by a factor of two (2). The nulls of the $SINC^2$ filter (such as indicated by reference numerals 34, 36, 38, etc.) are located at integer multiples of the sampling frequency of the input to the filter.

As discussed herein, the input of the second interpolator 14 of FIG. 1 corresponds to the output of the first interpolator 12. The images of signal $S(f_2)$ on signal line 18 have twice the bandwidth of the baseband signal and are centered around integer multiple of $f_2$ corresponding to the nulls (34, 36, 38, etc.) of the second interpolator 14. Accordingly, the $SINC^2$ filter is designed to have a lot of rejection where the images are located. In other words, the $SINC^2$ filter is configured in a manner such that there will be rejection in those regions. For NICAM systems, the baseband signal has a bandwidth of about 300 kHz. With K=4, the images are located at multiple of 1.456 MHz and the $SINC^2$ filter has nulls at the same frequencies (34, 36, 38 . . . ). As part of the interpolator process, the $SINC^2$ filter needs to be able to reject images of the interpolated signal. The final goal is to allow the original baseband signal to pass through and to reject the images up to half of the sampling frequency, which is 12 MHz in one embodiment (i.e., 24 MHz divided by two (2) equals 12 MHz).

The amplitude response shown in FIG. 2 is based upon an assumption that the interpolation factor L is a constant equal to 16. However, as discussed herein, the interpolator factor L may not always be constant and may change continuously, for example, by a factor of one (1). In one embodiment, the variable interpolation factor L can be either 16 or 17. Accordingly, while the amplitude response will look something like that shown in FIG. 2, it could have intervals of different duration. In other words, the interpolator amplitude response will change (i.e., be different) with time. Accordingly, FIG. 2 is representative of one example of an amplitude response of variable interpolator 14 where the interpolation factor is equal to sixteen (i.e., L=16) at a given moment in time. However, the locations of the nulls (e.g., 34, 36, 38, etc.) will change over time, according to the particular value of L at a given point in time. Furthermore, as discussed herein, the embodiments of the present disclosure relate to an interpolator that cannot be described by the theory of a uniformly sampled signal.

Figure 3:
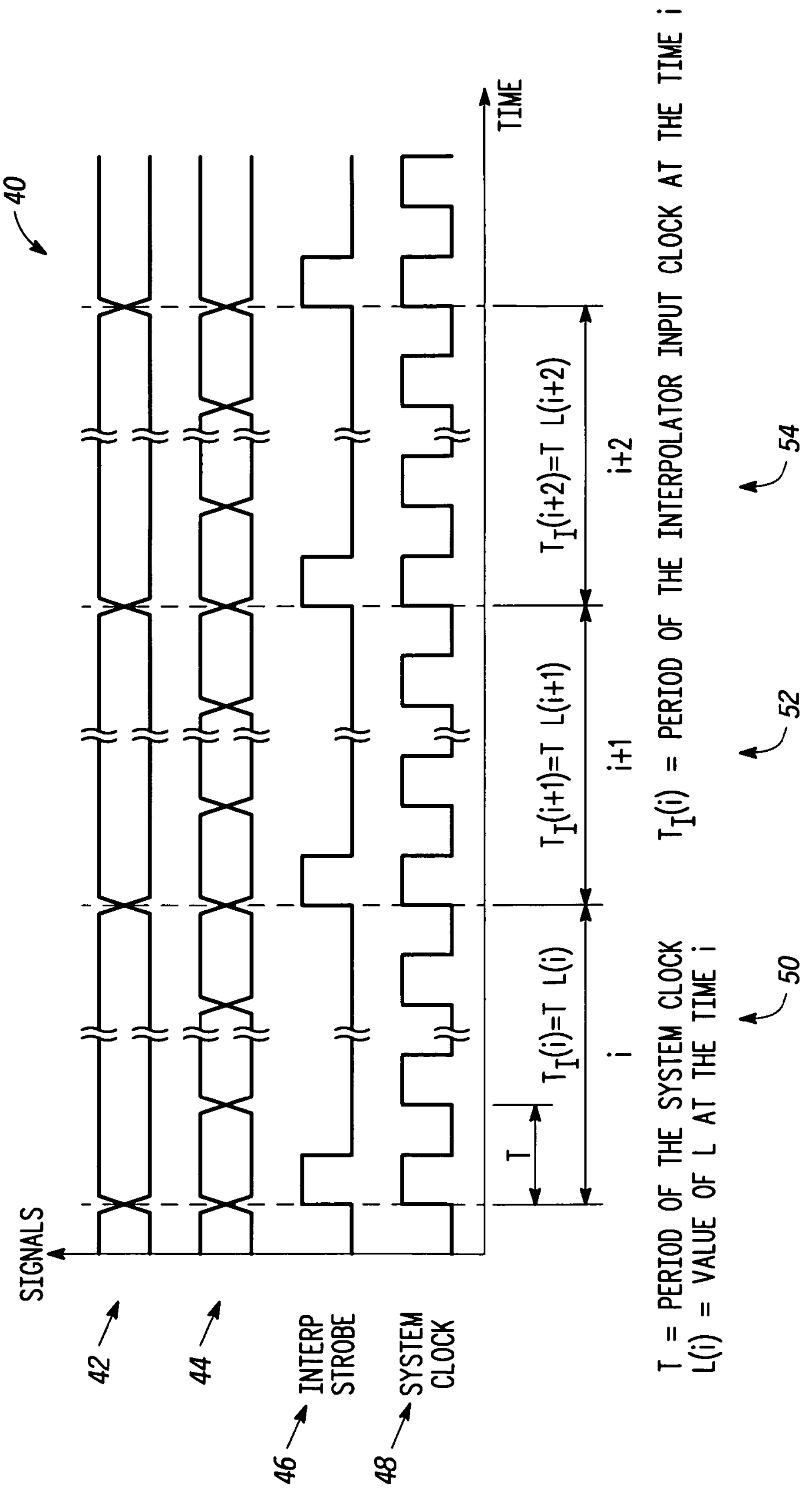
FIG. 3 is a timing diagram view of interpolator timing for an interpolator for non-uniformly sampled signals.

FIG. 3 is representative of a timing diagram 40 of the variable interpolator 14 of FIG. 1. Signal 48 is the system clock on input 24 with a period T, where the period T is constant. In one embodiment, the system clock is 24 MHz. Signal 46 is the interpolator strobe on input 22, which is the control signal for the input 18 of the variable interpolator 14. Interpolator strobe signal 46 informs the variable interpolator 14 when the input signal samples on input 18 are available. Signal 42 represents the input signal to the variable interpolator 14. Input signal samples of signal 42 are available at the occurrence of each new pulse of signal 46. In other words, upon an occurrence of a new pulse of interrupt strobe 46, the information available at the input of the variable interpolator 14 is valid.

The expressions "i", "i+1", and "i+2" represent examples of first, second, and third samples at the input of the variable interpolator. With respect to a duration of the input samples, the duration is not a constant (i.e., $T_I(i)=TL(i)$). $T_I(i)$ is the period of the interpolator input clock at time i and L(i) equals the value of L at the time i. The value of L depends upon the particulars of a given interpolation application. For example, L may equal 16, 17, or any other number. In one illustration, L can have a value of 16 or 17, wherein the particular value of 16 or 17 at any one time is random. Signal 44 is the output of the variable interpolator 14 and is valid upon the occurrence of the rising edge of the system clock.

While the intervals of timing diagram 40 are illustrated as having an appearance of being the same length, the reality is that the intervals could be the same length or different lengths from one another. T is the period of the system clock, which is constant. For a uniformly sampled signal, the sampling interval of the signal to be interpolated is T×L, while for a non-uniformly sampled signal the sampling interval is T×L(i). As indicated, L(i) represents the value of the interpolation factor for a given interval i. The expressions L(i), L(i+1), L(i+2), etc. are representative of variable interpolation factors over a number of intervals (i), (i+1), (i+2), etc. indicated by reference numerals 50, 52, 54, etc.

As discussed, in one embodiment, L can have a value that can randomly be equal to 16 or 17, during any given interval i. The particular value of L depends upon the particular variable interpolator application in which the variable interpolator is being used. In addition, in another embodiment, the value of L could vary by any amount, for example, (minimum value of L), (minimum value of L+1), (minimum value of L+2), etc. In a variable interpolator, L is variable and may not necessarily be limited to varying by just two values (e.g., 16 and 17). Accordingly, the embodiments of the present disclosure also include a general purpose variable interpolator.

Signal 44 represents the output of the variable interpolator. The outputs occur at the rising edge of the system clock. For each input of the variable interpolator, there are generated many outputs, which correspond to the interpolation factor L. Let's suppose that L equals 16 for interval 50. In other words, we're going to have 16 outputs in the interval 50, corresponding to i. Let's further suppose that L equals 17 for interval 52, corresponding to i+1. The timing diagram of FIG. 3 is drawn to illustrate a variable number of rising edges of the system clock within one or more of the intervals 50, 52, 54, etc. The number of samples is equivalent to the variable interpolator factor L in a given period or interval i. With respect to the interpolator input, the input value will be constant for the duration of the period $T_I(i)=T\cdot L(i)$. The number of samples of the interpolator output is determined by the period of the interpolator input clock during time interval i. L(i) is the value of L at time interval i. Reference numerals 50, 52, 54, etc. refer to first, second, third, etc. intervals of the variable interpolator input, output, interpolator strobe, and system clock.

FIG. 3 is thus representative of three intervals 50, 52, and 54 of the interpolator input, with additional intervals being represented by the series of dots " . . . ". While the intervals in the illustration of FIG. 3 appear to be of like duration, the value of L is to be considered for each interval to determine an associated length of the corresponding interval. In other words, the duration of each interval may vary, one from the next.

To more fully understand the embodiments of the present disclosure, the following discussion is presented. The transfer function of a SINC interpolator of order D for uniformly sampled signals is given by:

$$H(z)=(1+z^{-1}+z^{-2}+z^{-3}+\ldots+z^{-L+2}+z^{-L+1})^D \quad \text{(Equation 1)}$$

where L is the interpolation factor. The equation involves a z-transform, with a transfer function in the z-domain. Although H(z) is the transfer function of an FIR filter whose number of coefficients is D(L−1)+1, such an interpolator is rarely implemented as an FIR filter. That is, the interpolator is rarely implemented as an FIR because it would require too many memories and multiplications/additions. A more efficient implementation is obtained by taking into account that Equation 1 is a geometric progression. In fact, the sum of the L terms of the geometric progression of Equation 1 is given by:

$$H(z)=((1-z^{-L})/(1-z^{-1}))^D \quad \text{(Equation 2)}$$

Figure 4:
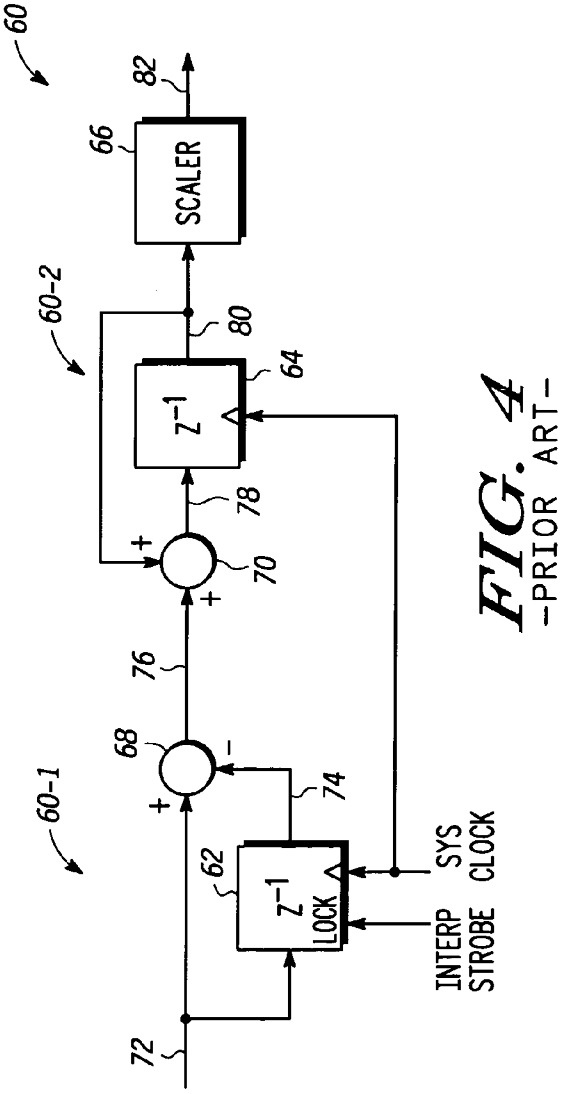
FIG. 4 is a block diagram view of a $SINC^2$ interpolator for uniformly sampled signals as is known in the art.

FIG. 4 illustrates one example of a $SINC^2$ filter (i.e., a sin (x)/x filter), as is known in the art. The $SINC^2$ filter is described by Equation 2, for D=2. The $SINC^2$ filter or interpolator implementation is generally indicated by reference numeral 60. A differentiator portion, generally indicated by reference numeral 60-1, implements the numerator of H(z), while the integrator portion generally indicated by the reference numeral 60-2, implements the denominator. The implementation of the delay $z^{-L}$ within the numerator of H(z) does not require L registers, but only one register 62 that is kept in a hold state by the interpolator strobe (INTERP STROBE), the interpolator strobe corresponding to a periodic pulse L times slower than the system clock (SYS CLOCK).

The differentiator 60-1 provides an output 76 which is operating at the rate of the system clock. The second part of the interpolator 60 is the integrator 60-2, which is represented by the denominator of the transfer function H(z). When interpolating a signal from a lower clock rate to a higher clock rate, the performing of the sample and hold function automatically implements a SINC filter of the first order. Repeating a data L times is an interpolation from a signal processing point of view. Accordingly, the interpolator 60 of FIG. 4 performs a $SINC^2$ function, because signal 72 is already interpolated by a SINC function, since it is repeated L times with respect to the system clock, and it is further interpolated by a SINC function implemented by the cascade of the differentiator 60-1 and the integrator 60-2. Therefore, the overall interpolation of interpolator 60 is a $SINC^2$ function.

The scaling block 66 operates on output 80 of unit delay 64 and provides an adjustment for gain that arises in the differentiator and integrator portions of the interpolator 60. Accordingly, the input 72 and the output 82 are made to have the same amplitude of signal via scaling block 66.

The differentiator portion 60-1 accurately computes the difference between the current input (i.e., current input sample) and the previous one (i.e., previous input sample) when both samples have the duration of L cycles of the system clock, and in addition, the difference has the same value for L cycles. The integrator portion 60-2 performs the integration of the difference at the system clock rate.

However, the circuit implementation of FIG. 4 does not work with non-uniformly sampled signals. A problem arises within the differentiator portion 60-1. In fact, the differentiator portion 60-1 produces correct results only when (i) the current input sample and the previous input sample, the later being stored in the differentiator register 62, have the same duration or (ii) the current sample is shorter in duration than the previous sample. When both samples have the same duration, the interpolator behaves exactly as the interpolator for uniformly sampled signals. However, when the current sample has a longer duration than the previous sample stored in the register, the differentiator portion 60-1 produces a correct result, in this example, only for a number of cycles that are equivalent to the duration of the previous stored sample.

When the duration of the previous sample is exceeded, the differentiator portion 60-1 keeps performing the difference between the current sample and the previous one held in the register beyond its real duration (i.e., actual duration), thus producing incorrect results which are then integrated by the integrator portion 60-2. When the current sample has a shorter duration than the previous one, the differentiator portion output is correct, because the differentiator portion 60-1 computes the difference only for the duration of the current sample (which in this example is shorter than the previous one). Subsequently, the previous sample in the register 62 is discarded and replaced with the current sample.

In a traditional interpolator implementation, it is assumed that the interpolator strobe is comprised of a constant period. However, in the case of a non-uniformly sampled input signal, there is a problem because the differentiator portion of the traditional interpolator cannot handle a non-uniformly sampled input signal. That is, the differentiator portion is unsuitable for processing input samples of different durations. So long as the current input sample is of the same duration as the previously stored sample, then the differentiator portion properly performs its function and provides a correct result. The problem arises when the duration of a current input sample and the previously stored sample have different durations (i.e., lengths). In the later instance, the differentiator portion produces errors, since the samples are of two different durations. For example, if the current signal 72 is longer than the signal 74 stored and delayed by the delay block 62 from a previous cycle, then the differentiator portion will produce erroneous data when the timing exceeds the duration of the delayed signal 74. In other words, the differentiator portion arbitrarily produces a value, which is in error, and thus creates a problem.

A dominant factor is the input sample of a longer duration than the duration of the previously stored sample. This causes erroneous results at the differentiator output. In particular, the problem is that at the summing junction 68, for a certain amount of time, erroneous results are produced, which are input into the integrator portion of the interpolator 60.

For the non-uniformly sampled input signals, the integrator portion integrates the erroneous values and produces a further erroneous result. Such an operation can build up a bias within the interpolator 60 that can push the good value of the signal (up or down). In other words, while an erroneous signal is correctly computed, the desired correct signal is riding on a bias that pushes the correct signal up or down. Thus, the interpolator 60 will not generate a correct result for a non-uniformly sampled signal.

The problem discussed herein above with respect to the interpolator of FIG. 4 could be solved by using a low-pass filter sampled directly at the system clock, because at the system clock frequency the signals are again uniformly sampled. However, if the low-pass filter were a finite impulse response (FIR) filter, then due to the high sampling rate it would require many coefficients and multipliers/adders to perform the convolution. An infinite impulse response (IIR) filter would have poles and zeros very close (i) to the unit circle and (ii) to the real axis due to the high sampling rate, compared to the signal bandwidth. To avoid limit cycles, it would be necessary to increase the coefficients and memory resolution with a corresponding increase in the size of multipliers and adders. Such a solution, however, would be impractical.

The embodiments of the present disclosure resolve the issue of non-uniformly sampled signals by using a chopper circuit within the SINC interpolator to force to zero output samples of the differentiator when their duration lasts more than the duration of the shortest sample of the non-uniformly sampled signals. In this way, the non-zero portion of each sample has the same duration and the differentiator of the SINC interpolator followed by the chopper always performs correctly the difference, because now the portion of each output sample of the differentiator containing erroneous results has been zeroed.

Figure 5:
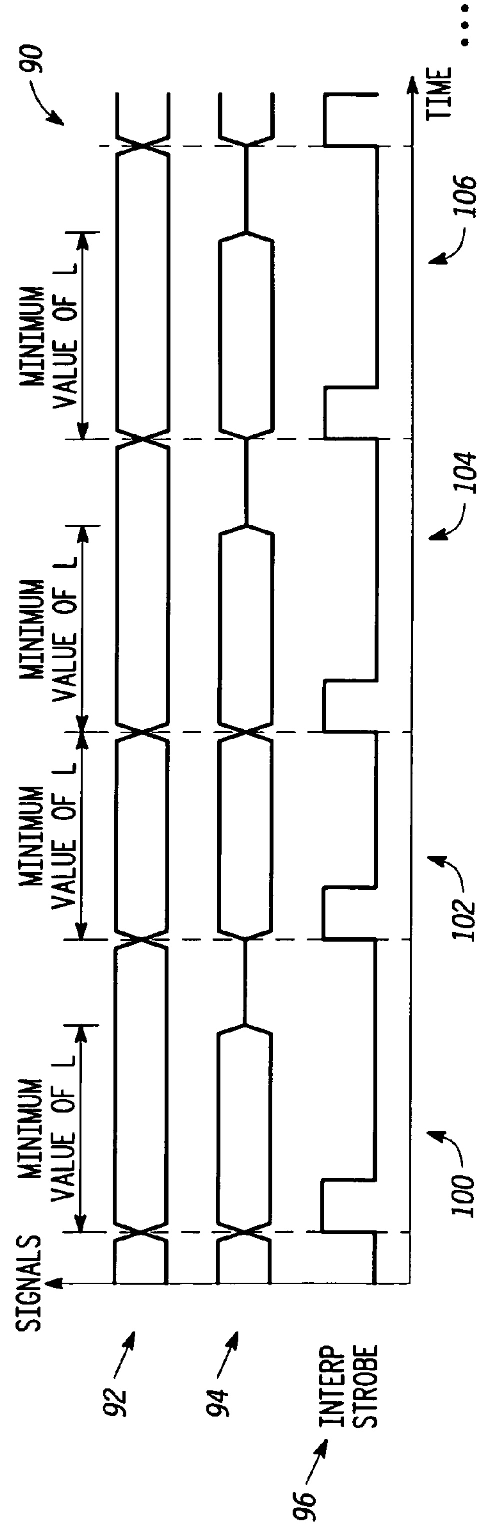
FIG. 5 is a timing diagram view of chopped interpolator timing signals for a $SINC^2$ interpolator for non-uniformly sampled signals according to one embodiment of the present disclosure.

FIG. 5 is a timing diagram for a $SINC^2$ interpolator according to one embodiment of the present disclosure. In particular, FIG. 5 provides an example of chopped signals in connection with the $SINC^2$ interpolator to be discussed with reference to FIG. 6. According to the embodiments of the present disclosure, the $SINC^2$ interpolator is configured to function correctly with a non-uniformly sampled input signal. Moreover, the $SINC^2$ interpolator includes a chopper circuit configured for performing a chopper function.

Referring again to FIG. 5, the interpolator strobe 96 is similar to the interpolator strobe 46 of FIG. 3. Signal 92 represents the chopper input, corresponding to the output of the differentiator. Signal 94 represents the chopper output. The variable interpolator embodiments of the present disclosure process the differentiator output (corresponding to signal 92) by chopping the same, as discussed further herein. The chopper function includes zeroing any portion of the differentiator output sample having a duration that is longer than a minimum duration of the non-uniformly sampled input signal. In other words, the chopper function zeros any portion of a sample of the differentiator output signal having a duration that extends beyond a minimum duration.

As discussed herein, for a given application in which L is variable, i.e., L can have more than one value, the range of values of L is assumed to be known by design. Accordingly, there is defined a minimum L and the chopper chops any differentiator output signal samples having a duration greater than the minimum value L. For example, interval 102 illustrates an occurrence of a minimum number of pulses, i.e., the chopper input duration is equal to the interpolator input duration in interval 102. In interval 100, the differentiator output exceeds the duration of minimum L, thus a tail end portion of the input is zeroed. In other words, the output of the chopper is represented by zero when the duration of minimum L has been exceeded. Similarly, in intervals 104 and 106, the interpolator input sample duration exceeds the minimum duration L, thus a corresponding tail end portions of the differentiator output samples are chopped (i.e., zeroed).

The chopper input signal contains intervals having valid portions of a same duration in each of intervals 100, 102, 104, 106, etc. The fixed duration of the valid portions of chopper input 92 is based upon a minimum value of L, which by design for a given variable interpolator application, the minimum value of L would be known. In interval 102, the interval is assumed to be equivalent to the minimum value of L, since the valid portion of the chopper input 92 begins and ends at the beginning and ending, respectively, of interval 102. The chopper function ensures that the differentiator output is sampled for the same duration, i.e., by the minimum value (or duration) of L, for all intervals 100, 102, 104, 106, etc. The duration of the non-zero portion of the chopped output will not exceed the minimum duration L. FIG. 5 thus illustrates the basic function to be implemented by the chopper circuit. By doing so, the variable interpolator produces desired correct results even with a non-uniformly sampled input signal.

Figure 6:
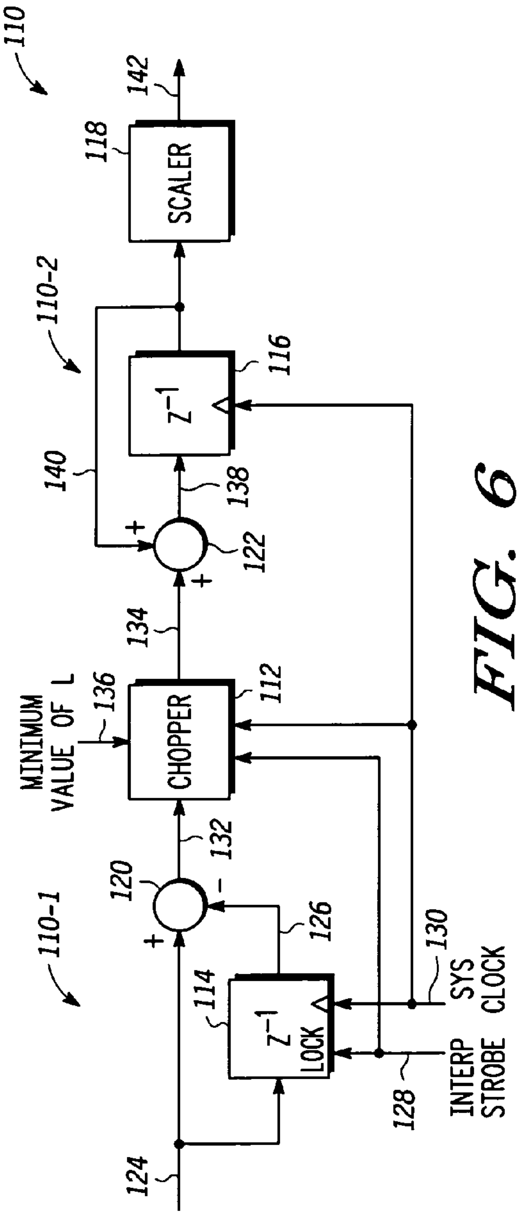
FIG. 6 is a $SINC^2$ interpolator for non-uniformly sampled signals according to one embodiment of the present disclosure.

FIG. 6 is a SINC$^2$ interpolator for non-uniformly sampled input signals according to one embodiment of the present disclosure. FIG. 6 is similar to the interpolator of FIG. 4; however, the embodiment of FIG. 6 differs in that it includes chopper circuit 112. From the figure, it can be seen that, except for the chopper function, the remainder of the implementation is similar in that there exists a differentiator portion that includes a subtraction block, a delay 114 which performs a sample and hold function, an integration portion, and a scale factor block. In this illustration, the system clock is at 24 MHz.

The minimum value of L is provided to chopper 112 at input 136. Interpolator input is represented by 124. Chopper 112 receives interpolator strobe on input 128. A counter (not shown) within chopper 112, clocked by the system clock 130 and reset by the interpolator strobe 128, determines a length of the incoming sample on chopper input 134. If the length of the incoming sample is longer in duration than the minimum value of L, then the chopper forces the portion of the input sample occurring beyond the duration of minimum L to zero.

Accordingly, the chopper 112 eliminates the problem experienced by the prior known interpolator by forcing to zero, portions of all differentiator output samples that exceed a predefined duration, i.e., a minimum duration L. By eliminating the error introduced by a non-uniformly sampled input signal, the variable interpolator according to the embodiments of the present disclosure produces desired correct results for interpolating either one or both of a uniformly sampled and a non-uniformly sampled input signal.

By modification of the original interpolator to include a chopper function, the efficient implementation of the sin (x)/x filter is now made suitable for interpolating non-uniformly sampled input signals, as well as, uniformly sampled input signals. Referring briefly back to the prior known interpolator circuit, such an interpolator circuit doesn't work for non-uniformly sampled signals. On the other hand, if the signal is processed directly at the maximum clock (i.e., the system clock), then all input signals are sampled uniformly. However, such an implementation would be very inefficient, and not very cost effective, in view of the very high clock rate of the system clock. A very long FIR filter would be required, etc.

With reference still to FIG. 6, according to one embodiment of the present disclosure, a variable interpolator 110 having an interpolation factor L for performing an interpolation of an input signal, where L is variable and includes a minimum value, comprises a differentiator 110-1, a chopper 112, and an integrator 110-2. The differentiator 110-1 includes an input 124 and an output 132, wherein the differentiator 110-1 is responsive to the interpolator input signal on the differentiator input 124 for performing a differentiator portion of the interpolation and for providing a differentiator result signal on the differentiator output 132. The chopper 112 is coupled with the differentiator for chopping the differentiator result signal as a function of the minimum value of L, wherein for an interpolator input signal that contains non-uniformly sampled signals in which there exists at least one sample of a shortest duration and at least one sample of a duration that extends beyond the shortest duration, the minimum value of L corresponds to the duration of the sample of shortest duration, and wherein for an interpolator input signal that contains uniformly sampled signals in which the samples are of a fixed duration, the minimum value of L corresponds to the fixed duration. The integrator 110-2 includes an input 134 and an output 142, wherein the integrator is responsive to the chopped differentiator result signal on the integrator input 134 for performing an integrator portion of the interpolation and for providing an integrator result signal on the integrator output 142, the integrator output corresponding to an output of the variable interpolator 110. In one embodiment, the chopper 112 chops the differentiator result signal as a function of the minimum value of L (at input 136) by forcing to zero any portion of a sample of the differentiator result signal 132 that may extend beyond the shortest duration.

In another embodiment, the chopper 112 includes a chopper input 132 for receiving the differentiator result signal, an interpolator strobe input 128 for receiving an interpolator strobe signal, a clock input 130 for receiving a clock signal, and an output 134. The chopper 112 is responsive to the differentiator result signal on the chopper input 132 (i) for chopping the differentiator result signal as a function of the minimum value of L, the interpolator strobe signal, and the clock signal and (ii) for providing a chopped differentiator result signal on the chopper output 134. Furthermore, the chopped differentiator result signal includes non-zeroed portions and zeroed portions, the non-zeroed portions corresponding to a differentiator result based on initial portions of each sample of the interpolator input signal having a duration equal to the shortest duration, and the zeroed portions corresponding to a differentiator result based on subsequent portions of each sample of the interpolator input signal that have a duration greater than the shortest duration.

The differentiator 110-1 comprises a unit delay 114 and a summing junction 120. The differentiator input 124 is coupled to an input of the unit delay 114 and to a positive input of the summing junction 120. The unit delay 114 has an input for receiving an interpolator strobe signal 128, a clock input for receiving a clock signal 130, and an output 126. The unit delay 114 is responsive to (i) a signal on the differentiator input 124, (ii) the interpolator strobe signal and (iii) the clock signal for outputting a unit delay output signal on the unit delay output 126. Furthermore, the unit delay output 126 is coupled to a negative input of the summing junction 120, wherein the summing junction further includes an output 132. The summing junction 120 is responsive to signals on the summing junction inputs for outputting a summed output signal on the summing junction output 132. The summing junction output 132 corresponds to an output of the differentiator 110-1.

The integrator 110-2 comprises a summing junction 122, a unit delay 116, and a scaler 118. The integrator input 134 is coupled to a first positive input of the summing junction 122. The summing junction 122 further has a second positive input and an output 138. The summing junction 122 is responsive to signals on the summing junction inputs for outputting a summed output on the summing junction output 138. Furthermore, the summing junction output 138 is coupled to an input of the unit delay 116. The unit delay 116 has a clock input 130 and an output 140. The unit delay 116 is responsive to the summing junction output signal and a clock signal on the clock input for outputting a unit delay output signal on the unit delay output 140. Still further, the unit delay output 140 is coupled to the second positive input of the summing junction 122 and to an input of the scaler 118, the scaler 118 further having an output 142. The scaler 118 is responsive to the unit delay output signal 140 for outputting a scaled output signal on the scaler output 142. The scaler output 142 corresponds to the output of the variable interpolator 110.

In one embodiment of the present disclosure, a SINC$^2$ interpolator as disclosed herein is suitable for use in a NICAM encoder. The SINC$^2$ interpolator is configured so as to interpolate non-uniformly sampled signals, the non-uniformly sampled signals originating as a result of a jittery clock produced by a timing circuit. Such a timing circuit may include, for example, a timing circuit of a front-end portion of the NICAM encoder.

Figure 7:
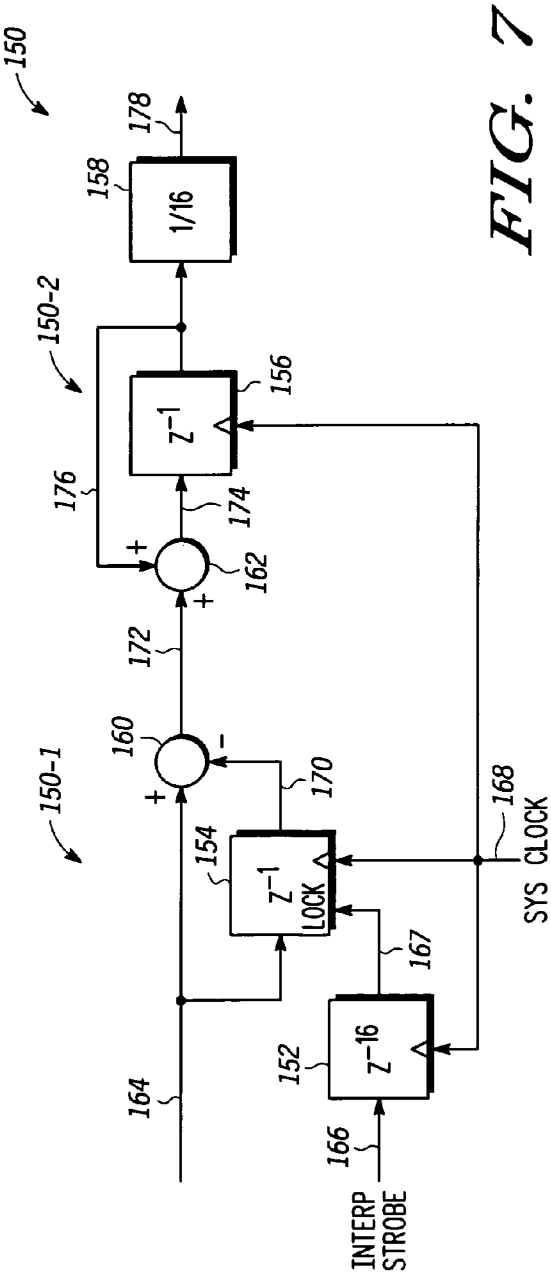
FIG. 7 is a $SINC^2$ interpolator for non-uniformly sampled signals according to another embodiment of the present disclosure.

In one implementation of the NICAM encoder for use with the embodiments of the present disclosure, there exists an interpolation factor L that can only assume the values of sixteen (16) and seventeen (17), as will also be discussed further herein with reference to FIG. 7. In such an implementation, the chopper includes a simple delay on an interpolator strobe for the differentiator register (i.e., via an interpolator strobe signal delay having a duration equal to the minimum duration of L). As a result, the combination of a delay on the interpolator strobe and a subtractor together performs a chopping function.

In response to both the current sample and a previous sample having an interpolation factor L equal to sixteen (i.e., L=16), the SINC$^2$ interpolator with chopper behaves similar to a SINC$^2$ interpolator (i.e., without a chopper) for uniformly sampled signals. That is, the delay of sixteen (16) cycles of system clock has no effect on the interpolator strobe. The differentiator also works properly when the current sample has a duration of sixteen cycles and the previous one has a duration of seventeen cycles, since in this instance, the difference is performed only for sixteen cycles, and then a new sample is processed by the differentiator.

However, in response to the current sample having an interpolation factor L equal to seventeen (i.e., L=17) and for a previous sample having an interpolation factor L equal to sixteen (i.e., L=16), the differentiator portion of the SINC$^2$ interpolator performs the difference for 16 cycles of the system clock. Since the delay on the interpolator strobe is only 16, while the pulses of the interpolator strobe for L=17 are 17 cycles apart, the delayed strobe becomes asserted on the sixteenth (16$^{th}$) cycle (i.e., one cycle earlier than the strobe for the current sample), thus causing the storage of the current sample into the differentiator register. On the seventeenth (17$^{th}$) cycle, both the current sample and stored sample have the same value. As a consequence, the output of the differentiator is zero, thus performing a chopping of the current sample.

A similar operation occurs in response to both the current and previous samples having the duration of seventeen (17) cycles. Thus, the configuration of the SINC$^2$ interpolator including a chopper or chopping circuit as discussed herein enables the SINC$^2$ interpolator to interpolate both uniformly and non-uniformly sampled signals with a minimal increase in hardware complexity.

FIG. 7 is another embodiment of the variable interpolator 150 of the present disclosure, wherein the variable interpolator includes a differentiator portion 150-1 and an integrator portion 150-2. The variable interpolator 150 is configured for an interpolator design in which the value of L can vary between either of two values (e.g., 16 or 17). With this simplification, an even more efficient implementation can be obtained. In this embodiment, the chopper function is now implemented by two blocks 152 and 160. Block 152 is a delay by sixteen (16) units with a one (1) bit input, corresponding to a fixed delay of a predetermined amount. Differentiator subtraction block 160 performs the chopping.

For illustration purposes, assume that the input contains a train of samples of exactly sixteen (16) pulses each. At delay block 152, the delay is placed on the signal of input 166, which is the interpolator strobe. In addition, since the delay is exactly sixteen (16), the input and output of the delay block will be the same, because each of the input samples is sixteen (16) pulses each. Accordingly, the differentiator 150-1 will work properly. That is, the difference between a current sample and a previous sample is calculated correctly because the current and previous samples are made to be of the same duration via the chopper.

Further in connection with the above illustration, in a non-ideal case of non-uniformly sampled input signals the following can occur. Assume that a current sample has the duration of seventeen (17) pulses. The interpolator strobe 166 is processed by delay 152 and thus delayed sixteen (16) periods of the system clock. For the first sixteen (16) periods of the system clock, the differentiator 150-1 performs the difference between the current sample and the one stored in the delay 152 by sixteen (16) delay units. At the end of the sixteen (16) delay units, the interpolator strobe is going to be delayed by sixteen (16) delay units and not by seventeen (17) delay units. Accordingly, the output of the delay of the interpolator strobe will show up one delay unit early than the interpolator strobe pulse. This means that the block 154 will lock or grab the current sample, even though it may not officially be time to do so (i.e., grabbing the current sample after 16 units of delay instead of seventeen (17) units of delay). In other words, the block 154 is forced to lock the current sample at sixteen (16) delay units, prior to the actual end of the duration of the current interpolator input sample, where L=17. In this example, while the duration of the input sample was L=17 on input 164, the interpolator chopped the sample at 16. In contrast, for a similar length input sample, the prior known interpolator had delayed the signal for its full duration of L=17. Since the block 152 implements a delay of sixteen (16), it is one unit less in duration that that of the current sample on the variable interpolator input 164.

Responsive to expiration of the delay by block 152, the output of block 152 locks 154 such that 154 grabs the current variable interpolator input. So, when the seventeenth (17$^{th}$) cycle of the system clock occurs on blocks 152 and 154, we have a situation where both signals 164 and 170 have the same value. By processing the interpolator strobe via block 152 and block 154, the current sample (of duration equal to seventeen (17)) is processed one cycle in advance. This means that if we perform the difference between the current sample 164 and the delayed sample 170, the difference is zero. Thus, for one cycle of the system clock, the output 172 will be zero. Accordingly, in the case of a variable interpolator input that is non-uniformly sampled (e.g., being either 16 or 17 units of duration long), while the minimum is 16 pulse cycles long, the chopper is designed to chop a signal which is too long and thus eliminates an undesirable erroneous result by the differentiator. In the embodiment of FIG. 7, the delay block 152, in combination with summing junction 160, performs the desired chopping function. In an efficient manner, readily available existing gates are used, with the exception of the delay block 152, to perform the function of the chopper as discussed herein.

As discussed, the dominant factor is when the current interpolation input is longer (e.g., 17) than the minimum duration (e.g., 16). In such an instance then, the interpolator strobe is output by delay block 152 upon expiration of the minimum number L of system clock pulse cycles (i.e., 16). As a result, the previous interpolator input stored in block 154 is processed prior to expiration of the duration of the current interpolator input. The pulse of the interpolator strobe will come out one unit delay early, compared to the longer duration of the current variable interpolator input signal on 164 (which in this example was said to have a duration of 17).

Furthermore, the integrator portion 150-2 is similar to that discussed herein with respect to FIG. 4. The integrator portion includes unit delay 156, adder function 162, and scaler 158. To provide a unit gain, the scaler 158 has a factor of 1/16, assuming the illustrative example of L=16 or 17. In particular, the scaler 158 is configured to provide an overall desired gain of the $SINC^2$ filter or variable interpolator 150, for example. The scaler can also be configured for providing a gain other than a unit gain, wherein the gain is selected according to the requirements of a given variable interpolator implementation.

In one embodiment of FIG. 7, the chopper comprises a portion of the differentiator 150-1. In such an embodiment, the differentiator 150-1 comprises a first unit delay 154, a chopper delay 152, and a first summing junction 160. The chopper delay 152 includes an input 166 for receiving an interpolator strobe signal, a clock input 168 for receiving a clock signal, and an output 167. The chopper delay is responsive to (a) the interpolator strobe signal and (b) the clock signal for outputting a chopper delayed interpolator strobe signal on the chopper delay output 167. In addition, the differentiator input 164 is coupled to an input of the first unit delay 154 and to a positive input of the first summing junction 160. The first unit delay 154 has an input for receiving the chopper delayed interpolator strobe signal 167, a clock input 168 for receiving a clock signal, and an output 170. The first unit delay 154 is responsive to (i) a signal on the differentiator input 164, (ii) the chopper delayed interpolator strobe signal 167 and (iii) the clock signal 168 for outputting a first unit delay output signal on the first unit delay output 170. Furthermore, the first unit delay output 170 is coupled to a negative input of the first summing junction 160, the first summing junction further having an output 172. The first summing junction 160 is responsive to signals on the first summing junction inputs for outputting a summed output signal on the first summing junction output 172. The first summing junction output corresponds to an output of the differentiator.

The integrator 150-2 comprises a second summing junction 162, a second unit delay 156, and a scaler 158. The integrator input 172 is coupled to a first positive input of the second summing junction 162. The second summing junction 162 also has a second positive input 176 and an output 174. The second summing junction 162 is responsive to signals on the second summing junction inputs for outputting a summed output on the second summing junction output 174. The second summing junction output 174 is coupled to an input of the second unit delay 156, the second unit delay further having a clock input 168 and an output 176. The second unit delay 156 is responsive to the second summing junction output signal 174 and a clock signal on the second unit delay clock input 168 for outputting a second unit delay output signal on the second unit delay output 176. The second unit delay output 176 is coupled to the second positive input of the second summing junction 162 and to an input of the scaler 158, the scaler further having an output 178. The scaler 158 is responsive to the second unit delay output signal 176 for outputting a scaled output signal on the scaler output 178. The scaler output corresponds to the output of the variable interpolator.

According to another embodiment, an interpolator comprises a fixed interpolator and a variable interpolator. The fixed interpolator has an interpolation factor K for performing an interpolation on an input signal, where K is a fixed value. The fixed interpolator has an input and an output, wherein responsive to the input signal on the fixed interpolator input, the fixed interpolator performs an interpolation on the input signal and provides a first interpolated signal on the fixed interpolator output. The variable interpolator has an interpolation factor L for performing a variable interpolation of the first interpolated signal, where L is variable and includes a minimum value. The variable interpolator comprises a differentiator, a chopper, and an integrator.

The differentiator has an input and an output, wherein the differentiator is responsive to the first interpolated signal on the differentiator input for performing a differentiator portion of the variable interpolation and for providing a differentiator result signal on the differentiator output. The chopper is coupled with the differentiator for chopping the differentiator result signal as a function of the minimum value of L. For a first interpolated signal that contains non-uniformly sampled signals in which there exists at least one sample of a shortest duration and at least one sample of a duration that extends beyond the shortest duration, the minimum value of L corresponds to the duration of the sample of shortest duration. For a first interpolated signal that contains uniformly sampled signals in which the samples are of a fixed duration, the minimum value of L corresponds to the fixed duration. The integrator has an input and an output, wherein the integrator is responsive to the chopped differentiator result signal on the integrator input for performing an integrator portion of the variable interpolation and for providing an integrator result signal on the integrator output. The integrator output corresponds to an output of the variable interpolator.

In the embodiment of the previous paragraph, the chopper chops the differentiator result signal as a function of the minimum value of L by forcing to zero any portion of a sample of the differentiator result signal that may extend beyond the shortest duration. In yet another embodiment, the chopper includes a chopper input for receiving the differentiator result signal, an interpolator strobe input for receiving an interpolator strobe signal, a clock input for receiving a clock signal, and an output, wherein the chopper is responsive to the differentiator result signal on the chopper input (i) for chopping the differentiator result signal as a function of the minimum value of L, the interpolator strobe signal, and the clock signal and (ii) for providing a chopped differentiator result signal on the chopper output. Furthermore, for the chopped differentiator result signal that includes non-zeroed portions and zeroed portions, the non-zeroed portions correspond to a differentiator result based on initial portions of each sample of the variable interpolator input signal having a duration equal to the shortest duration, and the zeroed portions correspond to a differentiator result based on subsequent portions of each sample of the variable interpolator input signal that have a duration greater than the shortest duration.

According to yet another embodiment of the present disclosure, a method of performing a variable interpolation of an input signal with an interpolation factor L, where L is variable and includes a minimum value, the method comprises: performing a differentiator portion of the interpolation in response to the input signal and providing a differentiator result signal; chopping the differentiator result signal as a function of the minimum value of L to provide a chopped differentiator result signal, wherein for a differentiator result signal that contains non-uniformly sampled signals in which there exists at least one sample of a shortest duration and at least one sample of a duration that extends beyond the shortest duration, the minimum value of L corresponds to the duration of the sample of shortest duration, and wherein for a differentiator result signal that contains uniformly sampled signals in which the samples are of a fixed duration, the minimum value of L corresponds to the fixed duration; and performing an integrator portion of the interpolation in response to the chopped differentiator result signal and providing an integrator result signal, the integrator result signal corresponding to an output signal of the variable interpolation.

In one embodiment, chopping the differentiator result signal as a function of the minimum value of L comprises forcing to zero any portion of a sample of the differentiator result signal that may extend beyond the shortest duration. In another embodiment, chopping the differentiator result signal further comprises (i) chopping the differentiator result signal as a function of the minimum value of L, an interpolator strobe signal, and a clock signal and (ii) providing the chopped differentiator result signal. Still further, the chopped differentiator result signal includes non-zeroed portions and zeroed portions, the non-zeroed portions corresponding to a differentiator result based on initial portions of each sample of the input signal having a duration equal to the shortest duration, and the zeroed portions corresponding to a differentiator result based on subsequent portions of each sample of the input signal that have a duration greater than the shortest duration.

Accordingly, the embodiments of the present disclosure provide for a very efficient implementation of a variable interpolator. The interpolator input signal is sampled at intervals of L cycles of the system clock, wherein L represents the interpolation factor. For non-uniformly sampled signals, the value of L is not constant, but variable. The embodiments of the present disclosure further relate to a $SINC^2$ interpolator configured for interpolating non-uniformly sampled signals. Such a variable interpolator can be included, for example, in an integrated circuit implementation of a NICAM encoder and/or other applications of sigma-delta DACs.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, while the embodiments of the present disclosure have been discussed with respect to $SINC^2$ interpolators, the chopper circuit can be used for $SINC^3$ interpolators as well. In addition, the system clock could comprise a frequency other than 24 MHz. The embodiments of the present disclosure still further comprise an integrated circuit that includes the variable interpolator as discussed herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A variable interpolator having an interpolation factor L for performing an interpolation of an input signal, where L is variable and includes a minimum value, the variable interpolator comprising:

a differentiator having an input and an output, wherein the differentiator is responsive to the interpolator input signal on the differentiator input for performing a differentiator portion of the interpolation and for providing a differentiator result signal on the differentiator output;

a chopper coupled with the differentiator for chopping the differentiator result signal as a function of the minimum value of L, wherein for an interpolator input signal that contains non-uniformly sampled signals in which there exists at least one sample of a shortest duration and at least one sample of a duration that extends beyond the shortest duration, the minimum value of L corresponds to the duration of the sample of shortest duration, and wherein for an interpolator input signal that contains uniformly sampled signals in which the samples are of a fixed duration, the minimum value of L corresponds to the fixed duration, wherein the chopper chops the differentiator result signal as a function of the minimum value of L by forcing to zero any portion of a sample of the differentiator result signal that may extend beyond the shortest duration; and an integrator having an input and an output, wherein the integrator is responsive to the chopped differentiator result signal on the integrator input for performing an integrator portion of the interpolation and for providing an integrator result signal on the integrator output, the integrator output corresponding to an output of the variable interpolator.

2. The variable interpolator of claim 1, wherein the differentiator comprises a unit delay and a summing junction, the differentiator input being coupled to an input of the unit delay and to a positive input of the summing junction, the unit delay having an input for receiving an interpolator strobe signal, a clock input for receiving a clock signal, and an output, the unit delay responsive to (i) a signal on the differentiator input, (ii) the interpolator strobe signal and (iii) the clock signal for outputting a unit delay output signal on the unit delay output, further wherein the unit delay output is coupled to a negative input of the summing junction, wherein the summing junction further includes an output, the summing junction responsive to signals on the summing junction inputs for outputting a summed output signal on the summing junction output, further wherein the summing junction output corresponds to an output of the differentiator.

3. The variable interpolator of claim 1, wherein the integrator comprises a summing junction, a unit delay, and a scaler, the integrator input being coupled to a first positive input of the summing junction, the summing junction further having a second positive input and an output, wherein the summing junction is responsive to signals on the summing junction inputs for outputting a summed output on the summing junction output, further wherein the summing junction output is coupled to an input of the unit delay, the unit delay further having a clock input and an output, wherein the unit delay is responsive to the summing junction output signal and a clock signal on the clock input for outputting a unit delay output signal on the unit delay output, further wherein the unit delay output is coupled to the second positive input of the summing junction and to an input of the scaler, the scaler further having an output, wherein the scaler is responsive to the unit delay output signal for outputting a scaled output signal on the scaler output, further wherein the scaler output corresponds to the output of the variable interpolator.

4. A variable interpolator having an interpolation factor L for performing an interpolation of an input signal, where L is variable and includes a minimum value, the variable interpolator comprising:

a differentiator having an input and an output, wherein the differentiator is responsive to the interpolator input signal on the differentiator input for performing a differentiator portion of the interpolation and for providing a differentiator result signal on the differentiator output;

a chopper coupled with the differentiator for chopping the differentiator result signal as a function of the minimum value of L, wherein for an interpolator input signal that contains non-uniformly sampled signals in which there exists at least one sample of a shortest duration and at least one sample of a duration that extends beyond the shortest duration, the minimum value of L corresponds to the duration of the sample of shortest duration, and wherein for an interpolator input signal that contains uniformly sampled signals in which the samples are of a fixed duration, the minimum value of L corresponds to the fixed duration, wherein the chopper includes a chopper input for receiving the differentiator result signal, an interpolator strobe input for receiving an interpolator strobe signal, a clock input for receiving a clock signal, and an output, wherein the chopper is responsive to the differentiator result signal on the chopper input (i) for chopping the differentiator result signal as a function of the minimum value of L, the interpolator strobe signal, and the clock signal and (ii) for providing a chopped differentiator result signal on the chopper output; and an integrator having an input and an output, wherein the integrator is responsive to the chopped differentiator result signal on the integrator input for performing an integrator portion of the interpolation and for providing an integrator result signal on the integrator output, the integrator output corresponding to an output of the variable interpolator.

5. The variable interpolator of claim 4, further wherein the chopped differentiator result signal includes non-zeroed portions and zeroed portions, the non-zeroed portions corresponding to a differentiator result based on initial portions of each sample of the interpolator input signal having a duration equal to the shortest duration, and the zeroed portions corresponding to a differentiator result based on subsequent portions of each sample of the interpolator input signal that have a duration greater than the shortest duration.

6. A variable interpolator having an interpolation factor L for performing an interpolation of an input signal, where L is variable and includes a minimum value, the variable interpolator comprising:

a differentiator having an input and an output, wherein the differentiator is responsive to the interpolator input signal on the differentiator input for performing a differentiator portion of the interpolation and for providing a differentiator result signal on the differentiator output;

a chopper coupled with the differentiator for chopping the differentiator result signal as a function of the minimum value of L, wherein for an interpolator input signal that contains non-uniformly sampled signals in which there exists at least one sample of a shortest duration and at least one sample of a duration that extends beyond the shortest duration, the minimum value of L corresponds to the duration of the sample of shortest duration, and wherein for an interpolator input signal that contains uniformly sampled signals in which the samples are of a fixed duration, the minimum value of L corresponds to the fixed duration, wherein the chopper comprises a portion of the differentiator; and an integrator having an input and an output, wherein the integrator is responsive to the chopped differentiator result signal on the integrator input for performing an integrator portion of the interpolation and for providing an integrator result signal on the integrator output, the integrator output corresponding to an output of the variable interpolator.

7. The variable interpolator of claim 6, wherein the differentiator comprises a first unit delay, a chopper delay, and a first summing junction, wherein the chopper delay includes an input for receiving an interpolator strobe signal, a clock input for receiving a clock signal, and an output, the chopper delay responsive to (a) the interpolator strobe signal and (b) the clock signal for outputting a chopper delayed interpolator strobe signal on the chopper delay output, further wherein the differentiator input being coupled to an input of the first unit delay and to a positive input of the first summing junction, the first unit delay having an input for receiving the chopper delayed interpolator strobe signal, a clock input for receiving a clock signal, and an output, the first unit delay responsive to (i) a signal on the differentiator input, (ii) the chopper delayed interpolator strobe signal and (iii) the clock signal for outputting a first unit delay output signal on the first unit delay output, further wherein the first unit delay output is coupled to a negative input of the first summing junction, wherein the first summing junction further includes an output, the first summing junction responsive to signals on the first summing junction inputs for outputting a summed output signal on the first summing junction output, further wherein the first summing junction output corresponds to an output of the differentiator.

8. The variable interpolator of claim 7, wherein L comprises a value selected from the group consisting of sixteen and seventeen, further wherein the minimum value of L equals sixteen.

9. The variable interpolator of claim 8, further wherein the chopper delay unit delays the interpolator strobe signal by sixteen delay units.

10. The variable interpolator of claim 7, wherein the integrator comprises a second summing junction, a second unit delay, and a scaler, the integrator input being coupled to a first positive input of the second summing junction, the second summing junction further having a second positive input and an output, wherein the second summing junction is responsive to signals on the second summing junction inputs for outputting a summed output on the second summing junction output, further wherein the second summing junction output is coupled to an input of the second unit delay, the second unit delay further having a clock input and an output, wherein the second unit delay is responsive to the second summing junction output signal and a clock signal on the second unit delay clock input for outputting a second unit delay output signal on the second unit delay output, further wherein the second unit delay output is coupled to the second positive input of the second summing junction and to an input of the scaler, the scaler further having an output, wherein the scaler is responsive to the second unit delay output signal for outputting a scaled output signal on the scaler output, further wherein the scaler output corresponds to the output of the variable interpolator.

11. The variable interpolator of claim 10, further wherein the chopper delay unit delays the interpolator strobe signal by sixteen delay units and wherein the scaler scales the second unit delay output signal by sixteen.

12. An interpolator comprising:

a fixed interpolator having an interpolation factor K for performing an interpolation on an input signal, where K is a fixed value, the fixed interpolator having an input and an output, wherein responsive to the input signal on the fixed interpolator input, the fixed interpolator performs an interpolation on the input signal and provides a first interpolated signal on the fixed interpolator output; and a variable interpolator having an interpolation factor L for performing a variable interpolation of the first interpolated signal, where L is variable and includes a minimum value, wherein the variable interpolator comprises:

a differentiator having an input and an output, wherein the differentiator is responsive to the first interpolated signal on the differentiator input for performing a differentiator portion of the variable interpolation and for providing a differentiator result signal on the differentiator output;

a chopper coupled with the differentiator for chopping the differentiator result signal as a function of the minimum value of L, wherein for a first interpolated signal that contains non-uniformly sampled signals in which there exists at least one sample of a shortest duration and at least one sample of a duration that extends beyond the shortest duration, the minimum value of L corresponds to the duration of the sample of shortest duration, and wherein for a first interpolated signal that contains uniformly sampled signals in which the samples are of a fixed duration, the minimum value of L corresponds to the fixed duration, wherein the chopper chops the differentiator result signal as a function of the minimum value of L by forcing to zero any portion of a sample of the differentiator result signal that may extend beyond the shortest duration; and an integrator having an input and an output, wherein the integrator is responsive to the chopped differentiator result signal on the integrator input for performing an integrator portion of the variable interpolation and for providing an integrator result signal on the integrator output, the integrator output corresponding to an output of the variable interpolator.

13. The interpolator of claim 12, wherein the chopper includes a chopper input for receiving the differentiator result signal, an interpolator strobe input for receiving an interpolator strobe signal, a clock input for receiving a clock signal, and an output, wherein the chopper is responsive to the differentiator result signal on the chopper input (i) for chopping the differentiator result signal as a function of the minimum value of L, the interpolator strobe signal, and the clock signal and (ii) for providing a chopped differentiator result signal on the chopper output.

14. The interpolator of claim 13, further wherein for the chopped differentiator result signal includes non-zeroed portions and zeroed portions, the non-zeroed portions corresponding to a differentiator result based on initial portions of each sample of the variable interpolator input signal having a duration equal to the shortest duration, and the zeroed portions corresponding to a differentiator result based on subsequent portions of each sample of the variable interpolator input signal that have a duration greater than the shortest duration.

15. A method of performing a variable interpolation of an input signal with an interpolation factor L, where L is variable and includes a minimum value, the method comprising:

performing a differentiator portion of the interpolation in response to the input signal and providing a differentiator result signal;

chopping the differentiator result signal as a function of the minimum value of L to provide a chopped differentiator result signal, wherein for a differentiator result signal that contains non-uniformly sampled signals in which there exists at least one sample of a shortest duration and at least one sample of a duration that extends beyond the shortest duration, the minimum value of L corresponds to the duration of the sample of shortest duration, and wherein for a differentiator result signal that contains uniformly sampled signals in which the samples are of a fixed duration, the minimum value of L corresponds to the fixed duration, wherein chopping the differentiator result signal as a function of the minimum value of L comprises forcing to zero any portion of a sample of the differentiator result signal that may extend beyond the shortest duration; and performing an integrator portion of the interpolation in response to the chopped differentiator result signal and providing an integrator result signal, the integrator result signal corresponding to an output signal of the variable interpolation.

16. A method of performing a variable interpolation of an input signal with an interpolation factor L, where L is variable and includes a minimum value, the method comprising:

performing a differentiator portion of the interpolation in response to the input signal and providing a differentiator result signal;

chopping the differentiator result signal as a function of the minimum value of L to provide a chopped differentiator result signal, wherein for a differentiator result signal that contains non-uniformly sampled signals in which there exists at least one sample of a shortest duration and at least one sample of a duration that extends beyond the shortest duration, the minimum value of L corresponds to the duration of the sample of shortest duration, and wherein for a differentiator result signal that contains uniformly sampled signals in which the samples are of a fixed duration, the minimum value of L corresponds to the fixed duration, wherein chopping the differentiator result signal further comprises (i) chopping the differentiator result signal as a function of the minimum value of L, an interpolator strobe signal, and a clock signal and (ii) providing the chopped differentiator result signal; and performing an integrator portion of the interpolation in response to the chopped differentiator result signal and providing an integrator result signal, the integrator result signal corresponding to an output signal of the variable interpolation.

17. The method of claim 16, wherein the chopped differentiator result signal includes non-zeroed portions and zeroed portions, the non-zeroed portions corresponding to a differentiator result based on initial portions of each sample of the input signal having a duration equal to the shortest duration, and the zeroed portions corresponding to a differentiator result based on subsequent portions of each sample of the input signal that have a duration greater than the shortest duration.

* * * * *